United States Patent
Matsumoto et al.

[19]

[11] Patent Number: 6,104,070
[45] Date of Patent: *Aug. 15, 2000

[54] SEMICONDUCTOR DEVICE WITH REDUCED NUMBER OF THROUGH HOLES AND METHOD OF MANUFACTURING THE SAME

[75] Inventors: Takeshi Matsumoto, Tokyo; Hiroaki Maruyama, Kanagawa, both of Japan

[73] Assignee: NEC Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/110,401

[22] Filed: Jul. 6, 1998

[30] Foreign Application Priority Data

Jul. 4, 1997 [JP] Japan .................................. 9-180091

[51] Int. Cl.$^7$ .......................... H01L 29/76; H01L 29/94; H01L 31/062; H01L 31/113; H01L 31/119
[52] U.S. Cl. ......................... 257/371; 257/369; 257/382; 257/384
[58] Field of Search ................................... 257/382, 383, 257/384, 369, 371

[56] References Cited

U.S. PATENT DOCUMENTS

| | | |
|---|---|---|
| 4,499,558 | 2/1985 | Mazin et al. . |
| 5,124,778 | 6/1992 | Adachi . |
| 5,157,281 | 10/1992 | Santin et al. . |
| 5,646,435 | 7/1997 | Hsu et al. ................................ 257/382 |
| 5,648,673 | 7/1997 | Yasuda .................................... 257/382 |
| 5,691,561 | 11/1997 | Goto ........................................ 257/382 |

FOREIGN PATENT DOCUMENTS

| | | |
|---|---|---|
| 006 428 | 1/1980 | European Pat. Off. . |
| 452 874 | 10/1991 | European Pat. Off. . |
| 60-120571 | 6/1985 | Japan . |
| 63-114160 | 5/1988 | Japan . |
| 64-11359 | 1/1989 | Japan . |
| 2-283062 | 11/1990 | Japan . |

OTHER PUBLICATIONS

"The Coupling of an N–Well CMOS Fabrication Laboratory Course with the Sematech Center of Excellence in Multi-level Metallization at Rensselaer" by Price et al., May 1993, pp. 183–187.
Patent Abstracts of Japan, Appln. No. 05207209, dated Feb. 1995, Manufacture of Semiconductor Device.
Patent Abstracts of Japan, Appln. No. 57146700, dated Feb. 1984, Structure of CMOS Element.
Patent Abstracts of Japan, Appln. No. 57216821, dated Jun. 1984, Semiconductor Integrated Circuit Device.

*Primary Examiner*—David Hardy
*Assistant Examiner*—Jesse A. Fenty
*Attorney, Agent, or Firm*—Sughrue, Mion, Zinn, Macpeak & Seas, PLLC

[57] ABSTRACT

A semiconductor device with reduced number of through holes is disclosed. A source region and a dielectric layer are connected by a conductive layer made of silicide formed on the surface of the source region and the dielectric layer commonly, and a drain region and an output electrode are connected by another conductive layer made of silicide. The conductive layer interconnecting the source region and the dielectric layer, and the conductive layer interconnecting the drain region and the output electrode are formed in one step as they are disposed beneath an insulation layer on the surface of the semiconductor substrate.

4 Claims, 4 Drawing Sheets

SEMICONDUCTOR DEVICE WITH REDUCED NUMBER OF THROUGH HOLES AND METHOD OF MANUFACTURING THE SAME

BACKGROUND OF THE INVENTION

1. Field of the Invention

The present invention relates to a semiconductor device for use as a switching transistor, and a method of manufacturing such a semiconductor device.

2. Description of the Related Art

There has heretofore been a semiconductor device in the form of a field-effect transistor (hereinafter referred to as an "FET") having $p^+$- and $n^+$-type regions formed in the surface of a p- or n-type semiconductor substrate. In the semiconductor device, a source region of the FET and a power supply electrode are generally connected to each other by an interconnection electrode. If the interconnection electrode and the power supply electrode are integrally formed with each other, then it is necessary to form a contact between the interconnection electrode and the source region. If the interconnection electrode and the source region are integrally formed with each other, then it is necessary to form a contact between the interconnection electrode and the power supply electrode. These contacts are not preferable because they would lower the productivity of semiconductor devices and increase the area of the surface of the semiconductor device.

A semiconductor device has been proposed in an attempt to solve the above problems, as disclosed in Japanese laid-open patent publication No. 2-283062. The disclosed semiconductor device will be described below with reference to FIGS. 1a and 1b of the accompanying drawings. FIGS. 1a and 1b show a structure of a CMOS (Complementary Metal Oxide Semiconductor) circuit as a semiconductor device. FIG. 1a is a plan view of the CMOS circuit, and FIG. 1b is a cross-sectional view taken along line A—A.

The CMOS circuit is formed on an n-type substrate 1 with a p-type well 2 in a surface thereof. The CMOS circuit includes a p-channel MOSFET 3 on the n-type substrate 1 and an n-channel MOSFET 4 on the p-type well 2.

An insulating layer 5 is disposed on the surface of the n-type substrate 1, and power supply electrodes 6, 7 of a metal such as aluminum are disposed respectively on opposite sides of the surface of the insulating layer 5. The power supply electrode 6 is connected to a positive terminal of a power supply (not shown), and the power supply electrode 7 is connected to ground.

An $n^+$-type conduction layer 8 is disposed in the surface of the n-type substrate 1, and the power supply electrode 6 is connected to the $n^+$-type conduction layer 8 through a through hole 9 defined in the insulating layer 5. Similarly, a $p^+$-type conduction layer 10 is disposed in the surface of the p-type well 2, and the power supply electrode 7 is connected to the $p^+$-type conduction layer 10 through a through hole 11 defined in the insulating layer 5.

A $p^+$-type source region 12 is disposed in the surface of the n-type substrate 1, and an $n^+$-type dielectric layer 13 is disposed adjacent to the $p^+$-type source region 12 in the surface of the n-type substrate 1. Likewise, an $n^+$-type source region 14 is disposed in the surface of the p-type well 2, and a $p^+$-type dielectric layer 15 is disposed adjacent to the n+-type source region 14 in the surface of the p-type well 2.

A through hole 16 defined in the insulating layer 5 extends to the surfaces of the source region 12 and the dielectric layer 13. A conductive layer 17 made of a metal such as aluminum is disposed on the surface of the insulating layer 5 and connected through the through hole 16 to the surfaces of the source region 12 and the dielectric layer 13.

Similarly, a through hole 18 defined in the insulating layer 5 extends to the surfaces of the source region 14 and the dielectric layer 15. A conductive layer 19 made of a metal such as aluminum is disposed on the surface of the insulating layer 5 and connected through the through hole 18 to the surfaces of the source region 14 and the dielectric layer 15.

An U-shaped gate electrode 20 made of a metal such as aluminum is disposed on the surface of the insulating layer 5 and extends from a position confronting the source region 12 to a position confronting the source region 14. A $p^+$-type drain region 21 is disposed in the surface of the n-type substrate 1 at a position confronting the gate electrode 20, and an $n^+$-type drain region 22 is disposed in the surface of the p-type well 2 at a position confronting the gate electrode 20.

An output electrode 23 of a metal such as aluminum is disposed on the surface of the insulating layer 5, and connected to the drain regions 21, 22 through a pair of through holes 24, 25 that are defined in the insulating layer 5. The output electrode 23 has an output terminal. Actually, the above structure of the CMOS circuit is covered with a protective layer (not shown) deposited on the uppermost surface thereof.

The p-channel MOSFET 3 comprises the gate electrode 20, the source region 12, and the drain region 21, and the n-channel MOSFET 4 comprises the gate electrode 20, the source region 14, and the drain region 22.

In the above CMOS circuit, the source region 12 of the p-channel MOSFET 3 is maintained at a positive potential applied from the power supply electrode 6, and the source region 13 of the n-channel MOSFET 4 is maintained at a ground potential by the power supply electrode 7 which is grounded.

Specifically, the potential applied from the power supply electrode 6 is conducted from the $n^+$-type conduction layer 8 connected thereto through the n-type substrate 1 to the $n^+$-type dielectric layer 13, from which the potential is conducted through the conductive layer 17 to the source region 12. Similarly, the ground potential from the power supply electrode 7 is conducted from the $p^+$-type conduction layer 10 connected thereto through the p-type well 2 to the $p^+$-type dielectric layer 15, from which the ground potential is conducted through the conductive layer 19 to the source region 14.

In the above CMOS circuit, therefore, the $n^+$- and $p^+$-type conduction layers 8, 10 are connected to the power supply electrodes 6, 7, and the $n^+$- and $p^+$-type dielectric layers 13, 15 are connected to the source regions 12, 14 by the conductive layers 17, 19 to keep the source regions 12, 14 and the power supply electrodes 6, 7 in a mutual conduction relationship without separate interconnections therebetween. Therefore, the power supply electrodes 6, 7 can freely be changed in position, and interconnections may be laid intermediate between the power supply electrodes 6, 7 and the conductive layers 17, 19.

A process of manufacturing the conventional CMOS circuit described above will briefly be described below by way of example. First, an n-type substrate 1 is prepared, and a p-type well 2 is formed in a surface thereof. Then, an $n^+$-type conduction layer 8, an $n^+$-type dielectric layer 13, a $p^+$-type source region 12, and a $p^+$-type drain region 21 are formed in another surface of the n-type substrate 1. A $p^+$-type conduction layer 10, a $p^+$-type dielectric layer 15, an $n^+$-type source region 14, and an $n^+$-type drain region 22 are formed in a surface of the p-type well 2.

Thereafter, an insulating layer 5 is uniformly deposited on the surface formed thus far on the n-type substrate 1. A through hole 9 reaching the surface of the conduction layer 8, a through hole 11 reaching the surface of the conduction layer 10, a through hole 16 reaching the common surface of the source region 12 and the dielectric layer 13, a through hole 18 reaching the common surface of the source region 14 and the dielectric layer 15, a through hole 24 reaching the surface of the drain region 21, and a through hole 25 reaching the surface of the drain region 22 are formed in the insulating layer 5.

Then, power supply electrodes 6, 7, conductive layers 17, 19, a gate electrode 20, and an output electrode 23, each made of a metal such as aluminum or the like, are formed on the surface of the insulating layer 5. The power supply electrode 6 is connected to the conduction layer 8 through the through hole 9, and the power supply electrode 7 is connected to the conduction layer 10 through the through hole 11. The source region 12 and the dielectric layer 13 are connected to the conductive layer 17 through the through hole 16, and the source region 14 and the dielectric layer 15 are connected to the conductive layer 19 through the through hole 18. The drain regions 21, 22 are connected to the output electrode 23 through the through holes 24, 25.

Because the conduction layers 8, 10 and the dielectric layers 13, 15 are connected respectively to the power supply electrodes 6, 7 and the source regions 12, 14, the power supply electrodes 6, 7 and the source regions 12, 14 are kept in a mutual conduction relationship without separate interconnections therebetween.

However, the conductive layers 17, 19 are required to connect the $n^+$- and $p^+$-type dielectric layers 13, 15 to the $p^+$- and $n^+$-type source regions 12, 14, and the through holes 16, 18 need to be formed in the insulating layer 5 in order to connect the conductive layers 17, 19 to the source regions 12, 14 and the dielectric layers 13, 15. These requirements make the productivity of the CMOS circuit relatively low.

While the output electrode 23 is connected to the drain regions 21, 22 through the through holes 24, 25, good conductivity can not be achieved by a single-point contact of the output electrode 23 with each of the drain regions 21, 22 because the drain regions 21, 22, comprising $p^+$- and $n^+$-type diffused layers, are of high resistance. One solution would be to make a number of through holes in the insulating layer 5 to increase the number of contacts of the output electrode 23 with the drain regions 21, 22. Such a solution would not be preferable because the productivity of the conventional CMOS circuit would be greatly reduced.

Since it is difficult to gain good conductivity between the output electrode 23 and the drain regions 21, 22, high performance capabilities cannot be expected of the conventional CMOS circuit, and the productivity of the conventional CMOS circuit is poor because of many through holes required. Furthermore, inasmuch as the conductive layers 17, 19 are exposed in gaps between the power supply electrodes 6, 7 and the gate electrode 20 on the surface of the insulating layer 5, it is difficult to form interconnections across those gaps, and hence the conventional CMOS circuit has a relatively low degree of integration.

SUMMARY OF THE INVENTION

It is an object of the present invention to provide a semiconductor device which includes drain regions having a relatively low resistance for high performance capabilities and can be manufactured with good productivity without the need for a number of through holes, and a method of manufacturing such a semiconductor device.

To achieve the above object, a semiconductor device according to an aspect of the present invention has a third conductive layer disposed beneath an insulating layer and interconnecting a source region and a dielectric layer. It is therefore not necessary to form a through hole in the insulating layer for interconnecting the source region and the dielectric layer.

A first electrode is connected to a first conductive layer disposed on a surface of a conduction layer to reduce the resistance between the first electrode and the conduction layer. Similarly, a second electrode is connected to a second conductive layer disposed on a surface of a drain region to reduce the resistance between the second electrode and the drain region.

Since no conductive layer is exposed on the surface of an insulating layer between the first electrode and a gate electrode, interconnections may be formed across a gap between the first electrode and the gate electrode.

The first, second, and third conductive layers may be formed in one step as they are disposed beneath the insulating layer on the surface of the semiconductor substrate.

A semiconductor device according to another aspect of the present invention is incorporated in a CMOS circuit having two MOSFETs of different conductivity types.

The CMOS circuit has a first MOSFET comprising a first gate electrode, a first source region, and a first drain region, and a second MOSFET comprising a second gate electrode, a second source region, and a second drain region.

According to still another aspect of the present invention, a semiconductor device has first, second, third, fourth, fifth, and sixth conductive layers each made of a silicide. A source region and a dielectric layer, which have opposite conductivity types, respectively, are connected to each other with good conductivity by a silicide conductive layer. A drain region of a semiconductor having a certain conductivity type and an output electrode of a metal are connected to each other with good conductivity by a silicide conductive layer.

The above and other objects, features, and advantages of the present invention will become apparent from the following description with reference to the accompanying drawings which illustrate an example of the present invention.

BRIEF DESCRIPTION OF THE DRAWINGS

FIG. 1b is a cross-sectional view taken along line A—A of FIG. 1a;

FIG. 2b is a cross-sectional view taken along line B—B of FIG. 2a;

DETAILED DESCRIPTION OF THE PREFERRED EMBODIMENT

Figure 1A:
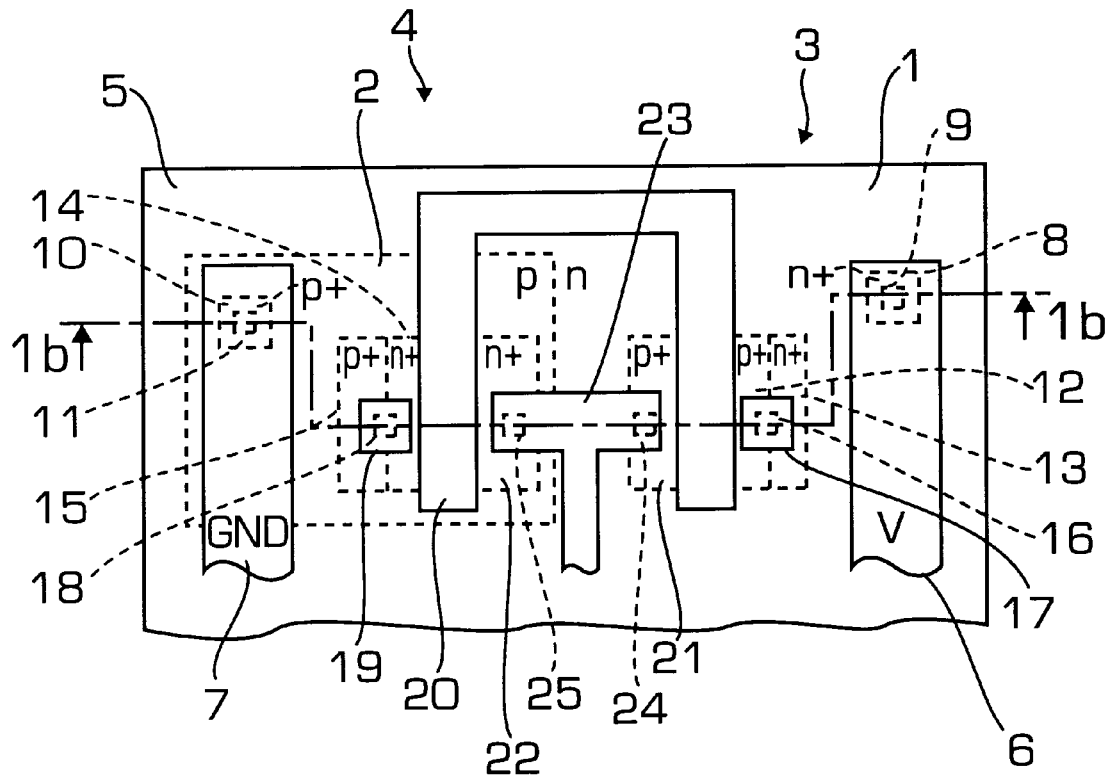
FIG. 1a is a plan view of a conventional semiconductor device.
Figure 1B:
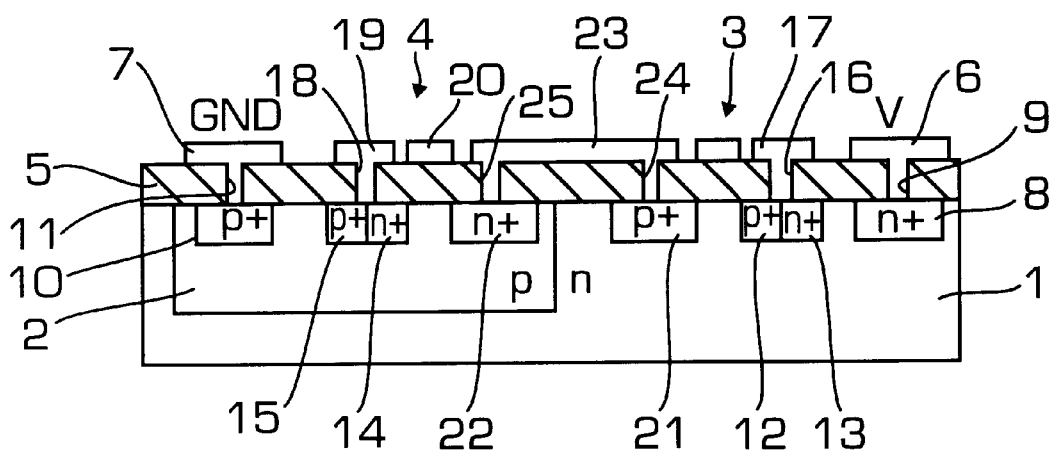
Figure 2A:
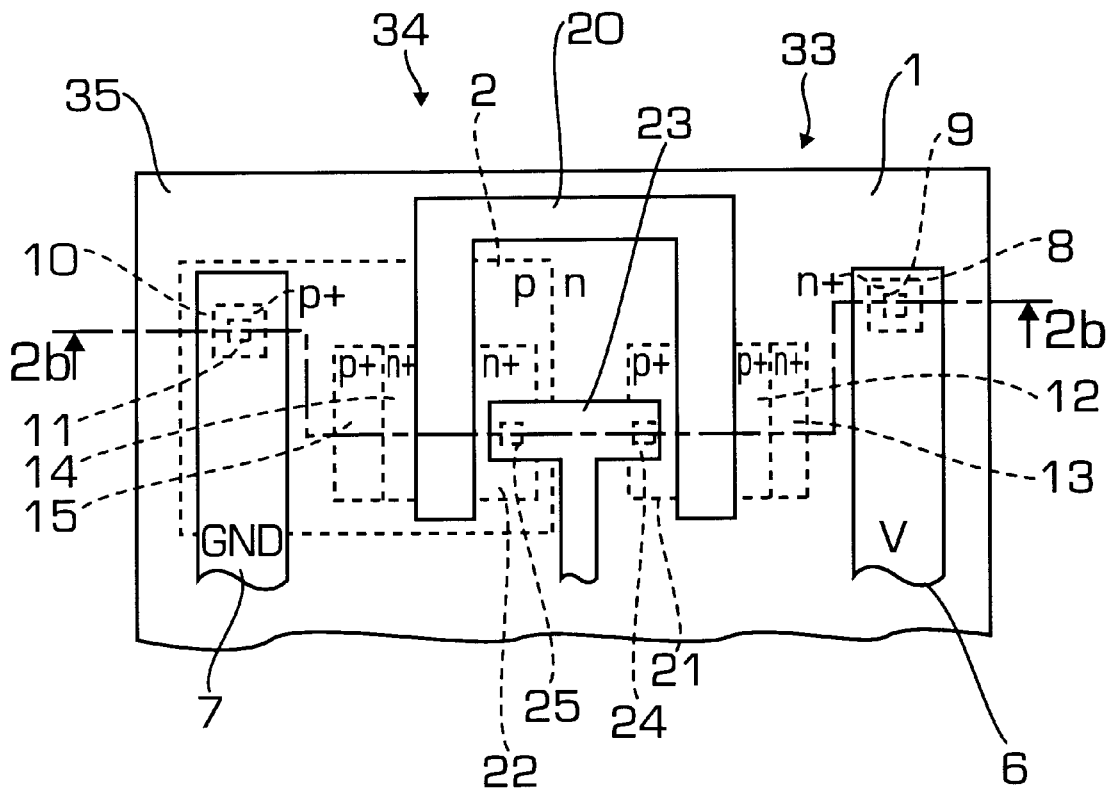
FIG. 2a is a plan view of a semiconductor device according to the present invention.
Figure 2B:
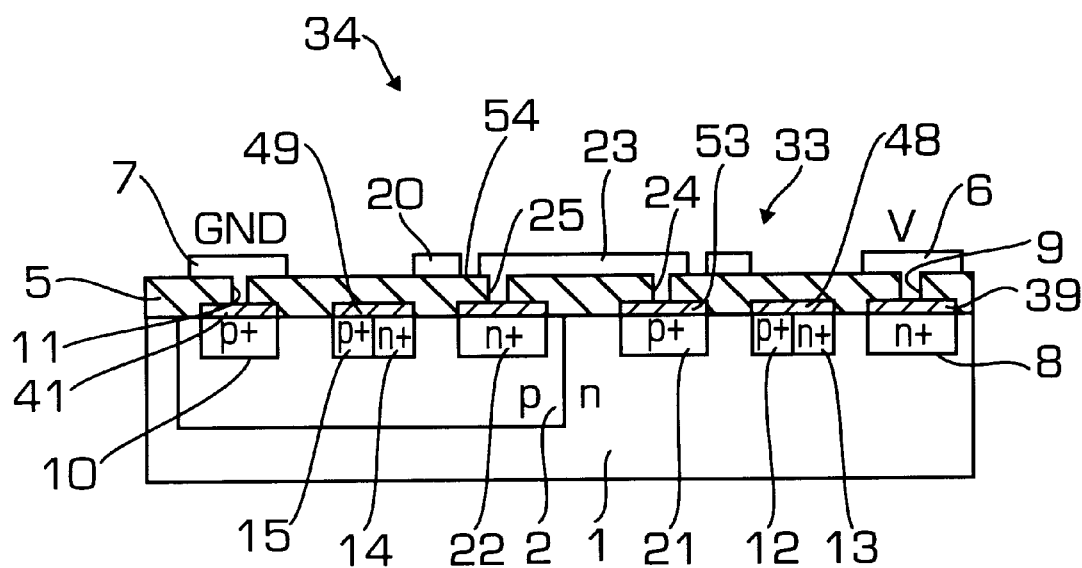

FIGS. 2a and 2b show a semiconductor device according to the present invention. Those parts of the semiconductor device shown in FIGS. 2a and 2b which are identical to those shown in FIGS. 1a and 1b are denoted by identical reference numerals, and will not be described in detail below.

The semiconductor device shown in FIGS. 2a and 2b is in the form of a CMOS circuit which comprises a p-channel MOSFET 33 and an n-channel MOSFET 34.

The p-channel MOSFET 33 includes a conductive layer 48 disposed on the common surface of the source region 12 and the dielectric layer 13, and a conductive layer 53 disposed between the output electrode 23 and the drain region 21.

The conductive layer 48 electrically connects the source region 12 and the dielectric layer 13 to each other, and the conductive layer 53 electrically connects the output electrode 23 and the drain region 21 to each other.

The n-channel MOSFET 34 includes a conductive layer 49 disposed on the common surface of the source region 14 and the dielectric layer 15, and a conductive layer 54 disposed between the output electrode 23 and the drain region 22.

The conductive layer 49 electrically connects the source region 14 and the dielectric layer 15 to each other, and the conductive layer 54 electrically connects the output electrode 23 and the drain region 22 to each other.

A conductive layer 39 is disposed between the conduction layer 8 and the power supply electrode 6, and similarly, a conductive layer 41 is disposed between the conduction layer 10 and the power supply electrode 7.

The conduction layer 8 and the power supply electrode 6 are electrically connected to each other by the conductive layer 39, and the conduction layer 10 and the power supply electrode 7 are electrically connected to each other by the conductive layer 41.

Each of the conductive layers 39, 41, 48, 49, 53, 54 comprises a low-resistance layer made of a silicide which is a compound of metal and silicon and has a resistance lower than polysilicon or the like.

Another electronic circuit (not shown) different from the CMOS circuit is disposed in a region outside of the CMOS circuit on the surface of the n-type substrate 1. The electronic circuit has interconnections (not shown) extending on the surface of the insulating layer 5 across gaps between the power supply electrodes 6, 7 and the gate electrode 20.

A process of manufacturing the CMOS circuit according to the present invention will be described below with reference to FIGS. 3a, 3b, 3c and 4a, 4b, 4c.

Figure 3A:
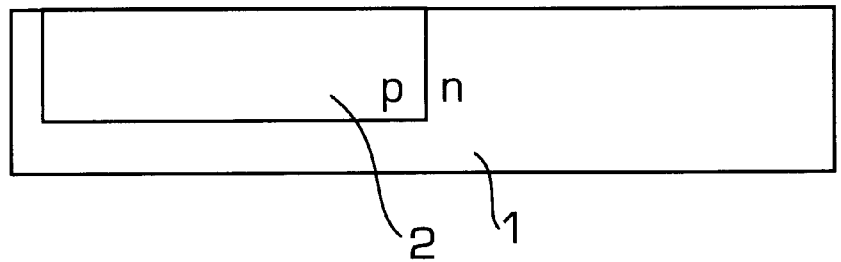
FIGS. 3a, 3b, 3c and 4a, 4b, 4c are cross-sectional views illustrative of a process of manufacturing the semiconductor device shown in FIGS. 2a and 2b.

First, an n-type substrate 1 is prepared, and a p-type well 2 is formed in a surface thereof as shown in FIG. 3a.

Figure 3B:
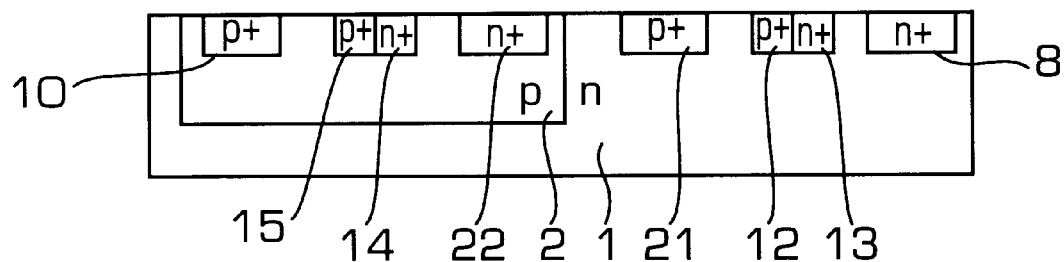

Then, as shown in FIG. 3b, an $n^+$-type conduction layer 8, an $n^+$-type dielectric layer 13, a $p^+$-type source region 12, and a $p^+$-type drain region 21 are formed in another surface of the n-type substrate 1. A $p^+$-type conduction layer 10, a $p^+$-type dielectric layer 15, an $n^+$-type source region 14, and an $n^+$-type drain region 22 are formed in a surface of the p-type well 2.

Figure 3C:
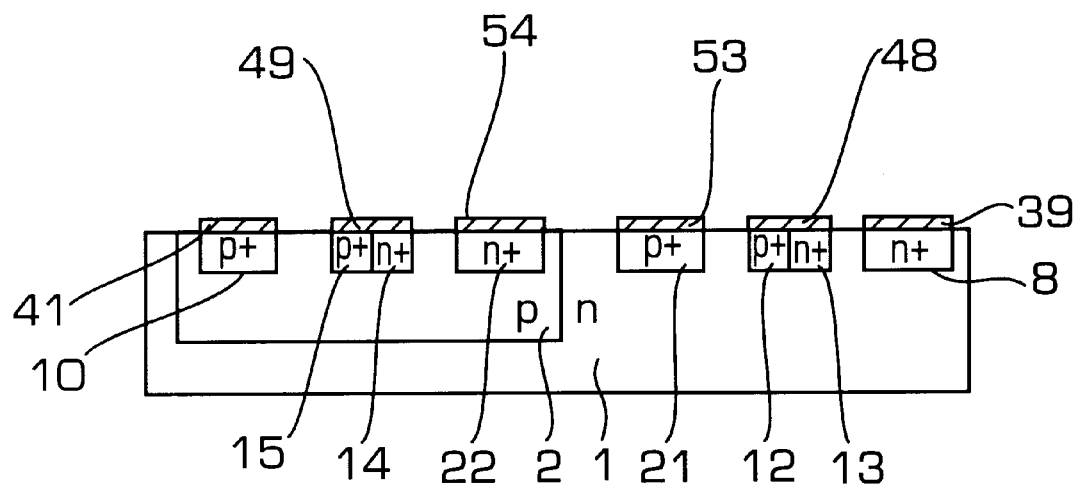

Thereafter, low-resistance conductive layers 39, 41, 48, 49, 53, 54 of a silicide are individually deposited respectively on the common surface of the dielectric layer 13 and the source region 12, the surface of the drain region 21, the surface of the conduction layer 10, the common surface of the dielectric layer 15 and the source region 14, and the surface of the drain region 22, as shown in FIG. 3c.

Figure 4A:
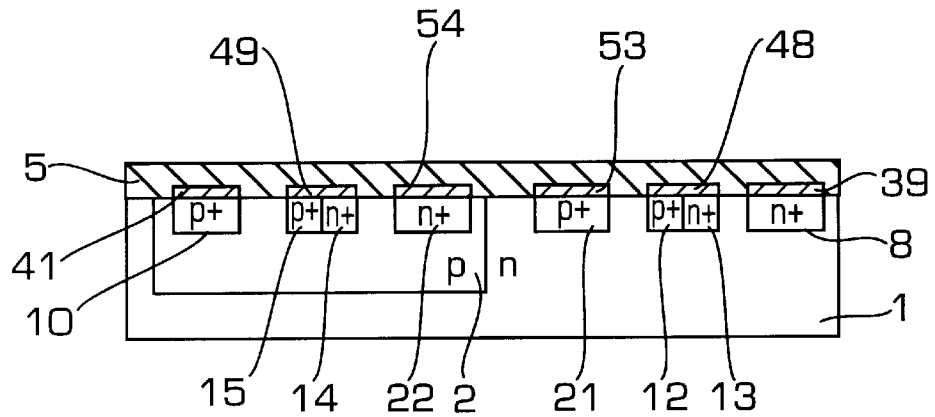

The surface formed thus far is uniformly covered with an insulating layer 5, as shown in FIG. 4a.

Figure 4B:
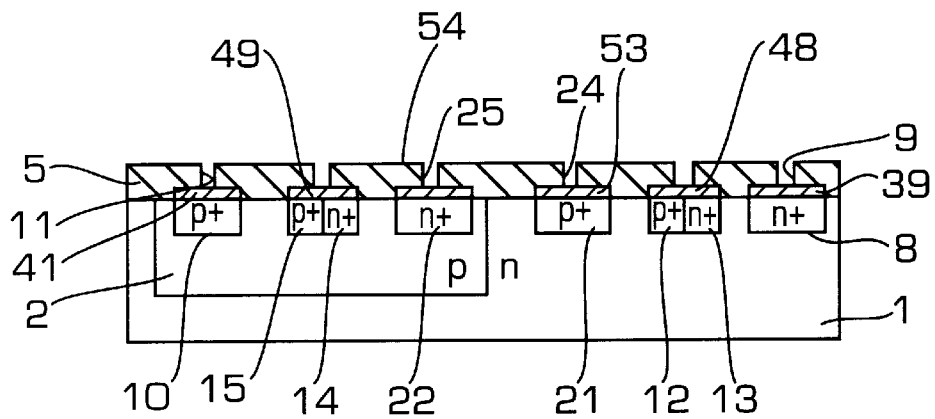

As shown in FIG. 4b, a through hole 9 reaching the conductive layer 39 on the surface of the conduction layer 8, a through hole 11 reaching the conductive layer 41 on the surface of the conduction layer 10, a through hole 24 reaching the conductive layer 53 on the surface of the drain region 21, and a through hole 25 reaching the surface of the conductive layer 54 on the surface of the drain region 22 are formed in the insulating layer 5.

Figure 4C:
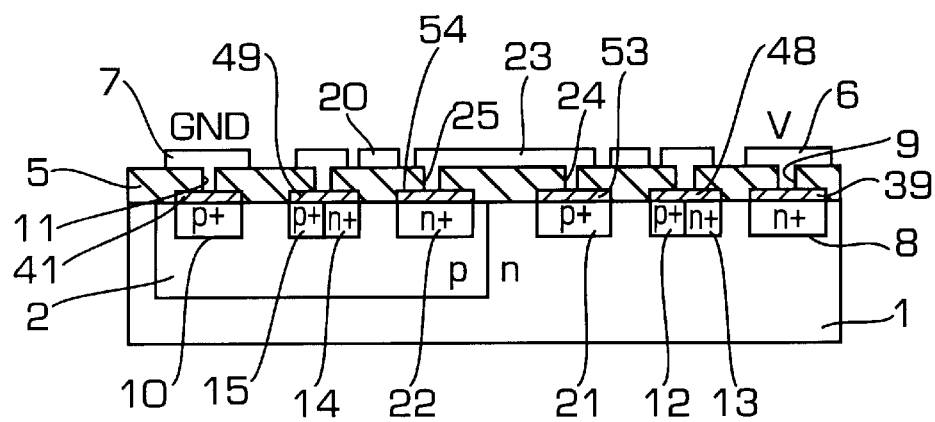

Then, power supply electrodes 6, 7, conductive layers 17, 19, a gate electrode 20, and an output electrode 23, each made of a metal such as aluminum or the like, are formed on the surface of the insulating layer 5. The power supply electrode 6 is connected to the conduction layer 8 through the through hole 9, and the power supply electrode 7 is connected to the conduction layer 10 through the through hole 11. The drain regions 21, 22 are connected to the output electrode 23 through the through holes 24, 25. In this manner, the CMOS circuit is completed as shown in FIG. 4c.

The other electronic circuit different from the CMOS circuit, which is disposed on the surface of the n-type substrate 1, can be formed simultaneously with the CMOS circuit. It is possible to form interconnections of the other electronic circuit at the same time as the power supply electrodes 6, 7, etc. of the CMOS circuit.

In the above CMOS circuit according to the present invention, as with the conventional CMOS circuit, the source region 12 of the p-channel MOSFET 33 is maintained at a positive potential applied from the power supply electrode 6, and the source region 13 of the n-channel MOSFET 34 is maintained at a ground potential by the power supply electrode 7 which is grounded.

Specifically, the potential applied from the power supply electrode 6 is conducted from the $n^+$-type conduction layer 8 connected thereto through the n-type substrate 1 to the $n^+$-type dielectric layer 13, from which the potential is conducted through the conductive layer 48 to the source region 12. Similarly, the ground potential from the power supply electrode 7 is conducted from the $p^+$-type conduction layer 10 connected thereto through the p-type well 2 to the $p^+$-type dielectric layer 15, from which the ground potential is conducted through the conductive layer 49 to the source region 14.

In the CMOS circuit according to the present invention, the $n^+$- and $p^+$-type dielectric layers 13, 15 are connected to the $p^+$- and $n^+$-type source regions 12, 14 by the low-resistance conductive layers 48, 49 of a silicide. Because the conductive layers 48, 49 are positioned below the insulating layer 5, it is not necessary to form through holes in the insulating layer 5 for connecting the dielectric layers 13, 15 to the source regions 12, 13.

Furthermore, the low-resistance conductive layers 53, 54 of a silicide are formed on the surfaces of the high-resistance drain regions 21, 22 which comprise $p^+$- and $n^+$-type diffused layers, and the output electrode 23 of a metal such as aluminum is connected to the conductive layers 53, 54. Consequently, the resistance of these connections is reduced without increasing the number of contacts of the output electrode 23 with the drain regions 21, 22, allowing the CMOS circuit to provide good performance capabilities.

Similarly, the low-resistance conductive layers 39, 41 of a silicide are formed on the surfaces of the high-resistance conduction layers 8, 10 which comprise $p^+$- and $n^+$-type diffused layers, and the power supply electrodes 6, 7 of a metal such as aluminum are connected to the conductive layers 39, 41. Consequently, the resistance of the connections between the power supply electrodes 6, 7 and the conduction layers 8, 10 is reduced.

The conductive layers 48, 49 which connect the dielectric layers 13, 15 to the source regions 12, 14 are positioned beneath the insulating layer 5, and are not exposed on the surface of the insulating layer 5 in gaps between the power supply electrodes 6, 7 and the gate electrode 20. Accordingly, interconnections can be formed freely across these gaps, and an integrated circuit including the CMOS circuit has a relatively high degree of integration.

The productivity of the CMOS circuit is high because the conductive layers 48, 49 interconnecting the source regions 12, 14 and the dielectric layers 13, 15, the conductive layers 53, 54 interconnecting the drain regions 21, 22 and the output electrode 23, and the conductive layers 39, 41 interconnecting the conduction layers 8, 10 and the power supply electrodes 6, 7 can be formed in one step.

While the CMOS circuit has a pair of p- and n-channel MOSFETs 33, 34 of opposite conductivity types in the illustrated embodiment, the principles of the present invention are applicable to a single transistor.

In the illustrated embodiment, the p-type well 2 is formed in the n-type substrate 1, the p-channel MOSFET 33 in the n-type substrate 1, and the n-channel MOSFET 34 in the p-type well 2. However, the present invention is also applicable to a CMOS circuit having an n-type region formed in a p-type substrate, an n-channel transistor formed in the p-type substrate, and a p-channel transistor formed in the n-type region.

While a preferred embodiment of the present invention has been described using specific terms, such description is for illustrative purpose only, and it is to be understood that changes and variations may be made without departing from the spirit or scope of the appended claims.

What is claimed is:

1. A semiconductor device comprising:
   a semiconductor substrate of a first conductivity type;
   a conduction layer of the first conductivity type disposed in a surface of said semiconductor substrate;
   a first semiconductor region of the first conductivity type disposed in a surface of said semiconductor substrate, said first semiconductor region confronting said conduction layer;
   a second semiconductor region of a second conductivity type disposed in a surface of said semiconductor substrate, said second semiconductor region confronting said first semiconductor region;
   a third semiconductor region of the second conductivity type disposed in a surface of said semiconductor substrate, said third semiconductor region confronting said second semiconductor layer;
   a conductive layer disposed to extend on both said first and second semiconductor regions;
   an insulating layer disposed to cover the surfaces of said semiconductor substrate, said conduction layer, said first, second, and third semiconductor layers;
   a gate electrode disposed on a channel region defined by said second and third semiconductor regions through said insulating layer; and
   a power supply electrode disposed on said insulating layer, for supplying a potential to said conduction layer through a through hole defined in said insulating layer;
   wherein, said potential is supplied to said second semiconductor region through said conductive layer, said first semiconductor region, said semiconductor substrate and said conduction layer.

2. A semiconductor device according to the claim 1, wherein said first and second semiconductor regions are covered continuously by said insulating layer.

3. A semiconductor device comprising:
   a semiconductor substrate of a first conductivity type;
   a first conduction layer of the first conductivity type disposed in a surface of said semiconductor substrate;
   a first semiconductor region of the first conductivity type disposed in a surface of said semiconductor substrate, said first semiconductor region confronting said first conduction layer;
   a second semiconductor region of a second conductivity type disposed in a surface of said semiconductor substrate, said second semiconductor region confronting said first semiconductor region;
   a third semiconductor region of the second conductivity type disposed in a surface of said semiconductor substrate, said third semiconductor region confronting said second semiconductor layer;
   a first conductive layer disposed to extend on both said first and second semiconductor regions;
   a well of the second conductivity type disposed in a surface of said semiconductor substrate;
   a second conduction layer of the second conductivity type disposed in a surface of said well;
   a fourth semiconductor region of the second conductivity type disposed in a surface of said well, said fourth semiconductor region confronting said second conduction layer;
   a fifth semiconductor region of the first conductivity type disposed in a surface of said well, said fifth semiconductor region confronting said fourth semiconductor region;
   a sixth semiconductor region of the first conductivity type disposed in a surface of said well, said sixth semiconductor region confronting said fifth semiconductor layer;
   a second conductive layer disposed to extend on both said fourth and fifth semiconductor regions;
   an insulating layer disposed to cover the surfaces of said semiconductor substrate, said first and second conduction layers, and said first, second, third, fourth, fifth, and sixth semiconductor layers;
   a first gate electrode disposed on a channel region defined by said second and third semiconductor regions through said insulating layer;
   a second gate electrode disposed on a channel region defined by said fifth and sixth semiconductor regions through said insulating layer;
   a first power supply electrode disposed on said insulating layer, for supplying a first potential to said first conduction layer through a first through hole defined in said insulating layer; and
   a second power supply electrode disposed on said insulating layer, for supplying a second potential to said second conduction layer through a second through hole defined in said insulating layer;
   wherein, said first potential is supplied to said second semiconductor region through said first conductive layer, said first semiconductor region, said semiconductor substrate and said first conduction layer; and
   said second potential is supplied to said fifth semiconductor region through said second conductive layer, said fourth semiconductor region, said well and said second conduction layer.

4. A semiconductor device according to the claim 3, wherein said first, second, fourth, and fifth semiconductor regions are covered continuously by said insulating layer.

* * * * *